United States Patent [19]
Loomis et al.

[11] Patent Number: 5,940,685
[45] Date of Patent: Aug. 17, 1999

[54] FABRICATION OF UV-SENSITIVE BACK ILLUMINATED CCD IMAGE SENSORS

[75] Inventors: Andrew H. Loomis, Chelmsford; James A. Gregory, Sudbury; Eugene D. Savoye, Concord; Bernard B. Kosicki, Acton, all of Mass.

[73] Assignee: The United States of America as represented by the Secretary of the Air Force, Washington, D.C.

[21] Appl. No.: 08/739,097

[22] Filed: Oct. 28, 1996

[51] Int. Cl.$^6$ .................................................. H01L 21/00
[52] U.S. Cl. .............................................. 438/60; 438/928
[58] Field of Search ................... 438/60, 72, 75, 438/770, 787, 928

[56] References Cited

U.S. PATENT DOCUMENTS

| | | | |
|---|---|---|---|
| 4,822,755 | 4/1989 | Hawkins et al. | 437/227 |
| 5,786,236 | 7/1998 | Thompson et al. | 438/60 |

*Primary Examiner*—Joni Chang
*Attorney, Agent, or Firm*—Robert L. Nathans

[57] ABSTRACT

The wafer thickness of a CCD front illuminated silicon wafer is reduced to about ten to twenty microns, the Al substrate is removed and a 5–35 nanometer silicon oxide layer is produced on the thinned back of the silicon wafer followed by implanting boron ions within the back surface to a depth up to about ten nanometers. Furnace annealing the wafer is now carried out, and the Al substrate is redeposited to enable the formation of gate contacts.

23 Claims, 1 Drawing Sheet

FABRICATION OF UV-SENSITIVE BACK ILLUMINATED CCD IMAGE SENSORS

STATEMENT OF GOVERNMENT INTEREST

The invention described herein may be manufactured and used by or for the Government for governmental purposes without the payment of any royalty thereon.

BACKGROUND OF THE INVENTION

The present invention relates to the field of image sensors.

Backside illuminated semiconductor photo-diode image sensors are known in the art; see for example U.S. Pat. No. 5,494,833 to Martin et al. Front-illuminated charged-coupled device (CCD) image sensors have demonstrated good performance in the visible and near IR portions of the spectrum. However, losses due to optical absorption in the polysilicon CCD gates cause moderate degeneration in quantum efficiency in the visible and severe degradation in the blue and UV portions of the spectrum. Back illuminated configurations have been used to reduce these losses,; however, an improved process for making back illuminated CCD image sensors is desired that provides near reflection limited UV quantum efficiency, together with excellent stability under UV exposure. Thinned, UV sensitive backside illuminated CCD image sensors have been fabricated by the inventors by means of high temperature processing steps necessary to produce the desired electric field and electrically passivated surfaces to return the best response for such a backside illuminated image sensor. Such procedures were referred to in a general fashion only in an M.I.T. Lincoln Laboratory Solid State Research Quarterly Technology Report of Jul. 30, 1993.

BRIEF SUMMARY OF A PREFERRED EMBODIMENT OF THE INVENTION

The improved process commences with providing a conventional, functioning front illuminated CCD Si wafer having polysilicon gates and an unsintered Al gate contact layer thereon. The wafer thickness is reduced to about ten to twenty microns, the Al substrate is removed and a silicon oxide layer is produced on the back of a silicon wafer having a thickness of about 35 nanometers, followed by implanting boron ions within the back surface to a depth up to about ten nanometers, then furnace annealing the wafer, and thereafter redepositing the Al gate contact layer.

BRIEF DESCRIPTION OF THE DRAWINGS

Other features and advantages of the invention will become apparent upon study of the following description, taken in conjunction with the drawings in which FIGS. 1–6 aid in the understanding of the various steps for carrying out the method of the invention.

DETAILED DESCRIPTION OF PREFERRED EMBODIMENTS OF THE INVENTION.

Figure 1:
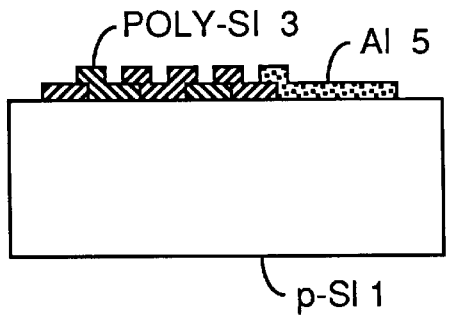
Figure 2:
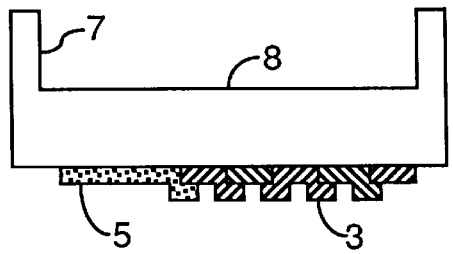
Figure 3:
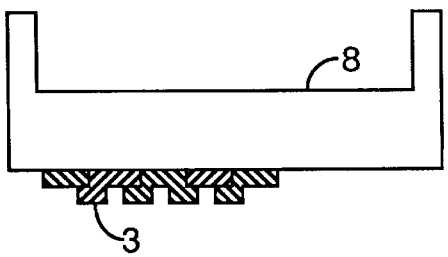

The process can begin with the acquisition of a functioning, readily available, front illuminated thin CCD Si wafer I shown in FIG. 1, that uses polysilicon gates 3 and aluminum metallization 5 that has not yet been sintered into Si contacts. The wafer is thinned to a thickness of 10–20 microns (see B. E. Burke, J. A. Gregory et al., Proc. SPIE 1693, 86 (1992)), as indicated in FIG. 2, leaving a circular Si rim 7 that is about 5 mm wide. This gives the thinned membrane mechanical support, permitting it to be handled by the rim with tweezers or vacuum wands. Although a 10–20 micron membrane thickness is preferred, we have successfully thinned these wafers to thicknesses between 5 and 50 microns. The details of this process form no part of the present invention. The unsintered Al metallization 5 is then stripped off as indicated in FIG. 3, allowing the wafer to receive high temperature treatments above the eutectic melting point of Al—Si at 577 degrees C.

Figure 4:
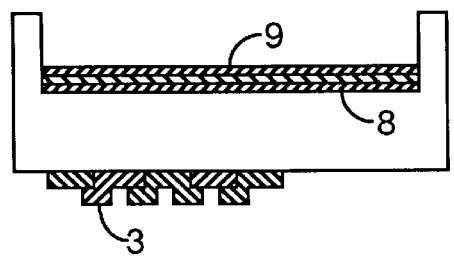

The Si wafer 1 is then entered into an oxidation furnace and an MOS quality oxide layer 9 is grown on the back wafer surface to a thickness in the vicinity of 35 nm as indicated in FIG. 4. We believe that thicknesses of 5 nm may be adequate, but we have not demonstrated this. It is important to suppress any interface states at the thinned surface, so care must be exercised in this growth. To form the Si oxide layer 9, we use 900 degrees C. in a dry $O_2$ ambient, for 150 minutes. These parameters may vary so that the time period could be lowered to about two hours, and the upper 900 degree temperature could vary between 750–950 degrees. It is also important to suppress the formation of dislocations in the thinned Si portion 8 during this step; these cause the appearance of hot columns and hot pixels during the operation of the finished CCD at the end of the process. Dislocations can be minimized by careful control of the heating and cooling of the wafer during the oxidation procedure.

More particularly, the wafers are loaded onto the cantilever wafer support arm of the horizontal tube oxidation furnace at room temperature and introduced into the tube furnace, which is at 500 degrees C., at a speed of 5 cm/min; during this time there is $N_2$ flowing through the tube. After insertion, the furnace is held at this temperature for 15 minutes and then ramped up to an elevated temperature of 900 degrees C. at 5 degrees C./min. The $N_2$ flow is then stopped and $O_2$ flow is initiated to oxidize the silicon for a period of about 150 minutes. After the oxidation is completed, the $O_2$ flow is stopped and the $N_2$ flow is resumed. The furnace is ramped down to 500 degrees C. at 2 degrees C./min, and held there for 15 minutes, after which the cantilever support arm and wafers are withdrawn at 5 cm/min. In this fashion, the temperature difference between the wafer and the furnace is minimized while the Si wafers are in a temperature zone having a temperature greater than approximately 600 degrees C., where plastic deformation of the Si occurs readily. We believe other prescriptions for temperature control may be possible, but we know that loading or unloading the furnace at 700 degrees C. or above leads to the generation of significant numbers of dislocations and should thus be avoided.

Figure 5:
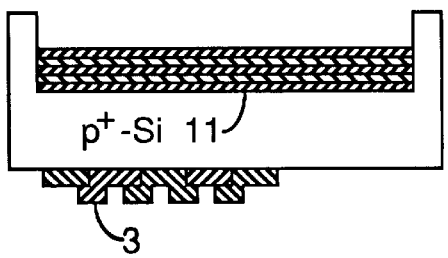
Figure 6:
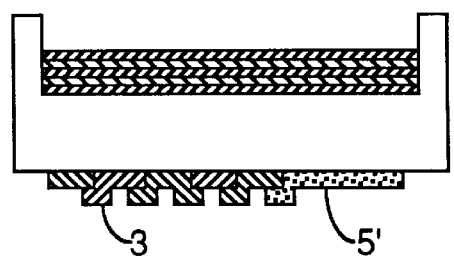

The next step calls for implantation of boron into the back surface to produce a heavily doped p+Si layer 11, as indicated in FIG. 5, that will provide an electric field in the Si which drives photoelectrons toward the buried channel of the CCD adjacent the polysilicon gates 3. We normally use $BF_2$ positive ions accelerated to 25 keV at a dose of 2.5×E14 ions/cm sq. The low voltage and presence of the oxide on the backside keeps the p+Si layer 11 within approximately 10 nm of the back illuminated surface, which is important for good response to ultraviolet or to low energy x-rays, where photons are absorbed within the first 5 or 10 nm of the Si surface 8. To minimize the redistribution of this dopant layer 11 during the now to be performed furnace annealing of the implant, we use a temperature of 850 degrees C. for 30 minutes in $N_2$, followed by 60 minutes at 500 degrees C. in forming gas of 5% $H_2$ and 95% $N_2$. We have not explored all possible anneal conditions, but, we believe the purpose of the 850 degrees C. anneal is to activate the implanted boron dopant atoms and the purpose of the 500 degrees C. anneal is to passivate defects by reacting them with gaseous $H_2$. Again, it is important to suppress dislocation formation, so during this latter anneal, we use the same sequence as mentioned above to load the wafers into the furnace at 500 degrees C. and reach the anneal temperature of 850 degrees C. by temperature ramping. After the anneal at the elevated temperature of about 850–900 degrees C., for a period of about 30 minutes, we reduce the temperature of the furnace by a 5 degree C./min ramp down rate to 500 degrees, while maintaining the flow of $N_2$. Elevated anneal temperatures between 700–950 degrees C. should also produce satisfactory results. It is undesirable to have the implanted boron atoms moving deeper into the CCD, since this would decrease the electric field on the back surface, so the temperature ramp down rate is increased to avoid diffusion of the boron. After the anneal is completed at 500 degrees C., for a period of about 30 minutes, the forming gas flow is terminated and $N_2$ flow is resumed while removing the wafers from the furnace. The aforesaid Al contacts to the gates 3 are now formed as indicated in FIG. 6.

The silicon oxide is thought to stabilize the surface states present on the bare silicon surface, so that the lifetime of carriers at the surface is greatly increased, thereby allowing nearly all of the carriers to be collected at the front surface in the CCD wells. Also, since virtually no photocarriers are trapped on or in the oxide, the electric fields in the Si remain unchanged, resulting in a stable quantum efficiency under illumination. The oxide thickness can also act as an antireflection coating for the spectral range of interest. In particular, a 35 nm oxide coating grown in dry oxygen at about 850 degrees C., for about 140 minutes, is optimum for the desired UV spectral range of 200–300 nm.

Variations in the foregoing will occur to those skilled in the art, and thus the scope of the invention is to be restricted solely by the terms of the following claims and art recognized equivalents thereof. For example, boron ions may be substituted for boron fluoride as an implant species, and thus the term "boron positive ions" as used below, is intended to include boron per se and in this case the associated energy range would be one to ten keV and the dosage ranges would be within the range of 2×E13–2×E15/cm squared. Where p-channel CCD arrays rather than n-channel arrays are to be fabricated, phosphorous implants can be employed for an n+ back surface. The term "forming gas" is intended to include the use of pure hydrogen. We have also eliminated the silicon oxide formation step, and the resulting product works, but not as well as having about 35 nm of the silicon oxide. Thus, the oxide layer could have a thickness of 0–35 nm as set forth below.

What is claimed is:

1. Method of processing a thinned silicon image sensor wafer comprising the steps of:
   (a) producing a silicon oxide layer upon the back wafer surface of said silicon wafer;
   (b) implanting boron ions into said back wafer surface to a depth of up to about 10 nanometers to produce a heavily doped p+ region; and
   (c) furnace annealing said wafer.

2. The method of claim 1 wherein step (a) is carried out to produce a silicon oxide layer having a thickness of about 35 nanometers.

3. The method of claim 1 wherein step (a) is performed by exposing said wafer to an elevated temperature of between 750–950 degrees C. in a dry oxygen atmosphere for 2.0–2.5 hours.

4. The method of claim 2 wherein step (a) is performed by exposing said wafer to an elevated temperature of between 750–950 degrees C. in a dry oxygen atmosphere for 2.0–2.5 hours.

5. The method of claim 1 wherein before the performance of step (a), said wafer is initially exposed to a temperature of about 500 degrees C. for about 15 minutes and the temperature is thereafter ramped up to said elevated temperature at about 5 degrees C./minute.

6. The method of claim 3 wherein before the performance of step (a), said wafer is initially exposed to a temperature of about 500 degrees C. for about 15 minutes and the temperature is thereafter ramped up to said elevated temperature at about 5 degrees C./minute.

7. The method of claim 5 wherein after the performance of step (a), the temperature is ramped down to about 500 degrees C. at about 2 degrees C./min.

8. The method of claim 6 wherein after the performance of step (a), the temperature is ramped down to about 500 degrees C. at about 2 degrees C./min.

9. The method of claim 1 wherein step (b) is performed by implanting boron positive ions into the wafer at a dosage of 2×E13–2×E15 ions/cm squared.

10. The method of claim 2 wherein step (b) is performed by implanting boron positive ions into the wafer at a dosage of 2×E13–2×E15 ions/cm squared.

11. The method of claim 3 wherein step (b) is performed by implanting boron positive ions into the wafer at a dosage of 2×E13–2×E15 ions/cm squared.

12. The method of claim 5 wherein step (b) is performed by implanting boron positive ions into the wafer at a dosage of 2×E13–2×E15 ions/cm squared.

13. The method of claim 1 wherein step (c) includes furnace annealing said wafer at a temperature of 700–950 degrees C. for about thirty minutes followed by further annealing at about 500 degrees C. for about sixty minutes in a forming gas mixture having hydrogen therein.

14. The method of claim 2 wherein step (c) includes furnace annealing said wafer at a temperature of 700–950 degrees C. for about thirty minutes followed by further annealing at about 500 degrees C. for about sixty minutes in a forming gas mixture having hydrogen therein.

15. The method of claim 3 wherein step (c) includes furnace annealing said wafer at a temperature of between 700–950 degrees C. for about thirty minutes followed by further annealing at about 500 degrees C. for about sixty minutes in a forming gas mixture having hydrogen therein.

16. The method of claim 7 wherein step (c) includes furnace annealing said wafer at a temperature of between 700–950 degrees C. for about thirty minutes followed by further annealing at about 500 degrees C. for about sixty minutes in a forming gas mixture having hydrogen therein.

17. Method of processing a thinned silicon image sensor wafer comprising the steps of:
   (a) producing a silicon oxide layer upon the back wafer surface of said silicon wafer;
   (b) implanting boron positive ions into said back wafer surface to a depth of up to about 10 nanometers to produce a doped p+ region having a dosage of between 2×E13–2×E15 ions/cubic cm;
   (c) furnace annealing said wafer at an annealing temperature of 700–950 degrees C. for about thirty minutes followed by further annealing at about 500 degrees C. for about sixty minutes in a forming gas mixture having hydrogen therein.

18. The method of claim 17 wherein step (a) is carried out to produce a silicon oxide layer having a thickness of about 35 nanometers.

19. The method of claim 17 wherein step (a) is performed by exposing said wafer to an elevated temperature of 750–950 degrees C. in a dry oxygen atmosphere for 2–2.5 hours.

20. The method of claim 19 wherein before the performance of step (a), said wafer is initially exposed to a temperature of about 500 degrees C. for about 15 minutes and the temperature is thereafter ramped up to said elevated temperature at about 5 degrees C./minute.

21. The method of claim 20 wherein after the performance of step (a), the temperature is ramped down to about 500 degrees C. at about 2 degrees C./min.

22. The method of claim 21 wherein before the performance of step (c), said wafer is initially exposed to a temperature of about 500 degrees C. for about 15 minutes and the temperature is thereafter ramped up to said elevated temperature at about 5 degrees C./minute.

23. The method of claim 22 wherein after the performance of step (c), the temperature is ramped down to about 500 degrees C. at about 5 degrees C./min.

* * * * *